(12) United States Patent
Kageyama

(10) Patent No.: US 11,391,788 B2
(45) Date of Patent: Jul. 19, 2022

(54) POWER CONVERSION DEVICE AND GROUND FAULT LOCATION DIAGNOSIS METHOD

(71) Applicant: Hitachi Industrial Equipment Systems Co., Ltd., Tokyo (JP)

(72) Inventor: Hiroshi Kageyama, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 2 days.

(21) Appl. No.: 17/260,028

(22) PCT Filed: Jul. 11, 2019

(86) PCT No.: PCT/JP2019/027593
§ 371 (c)(1),
(2) Date: Jan. 13, 2021

(87) PCT Pub. No.: WO2020/026755
PCT Pub. Date: Feb. 6, 2020

(65) Prior Publication Data
US 2021/0270911 A1 Sep. 2, 2021

(30) Foreign Application Priority Data
Jul. 31, 2018 (JP) .............................. JP2018-143419

(51) Int. Cl.
*G01R 31/52* (2020.01)
*G01R 31/08* (2020.01)
(Continued)

(52) U.S. Cl.
CPC ........... *G01R 31/52* (2020.01); *G01R 31/083* (2013.01); *H02H 3/165* (2013.01); *H02H 7/0838* (2013.01); *H02M 1/32* (2013.01)

(58) Field of Classification Search
CPC ............... G01R 31/083; G01R 31/52; H02M 7/5387; H02M 1/32; H02M 1/0009; H02M 5/44; H02H 3/165; H02H 7/0838; H02P 29/027
(Continued)

(56) References Cited

U.S. PATENT DOCUMENTS

| | | | |
|---|---|---|---|
| 6,320,731 B1 | 11/2001 | Eaves et al. | |
| 2011/0241590 A1* | 10/2011 | Horikoshi | H02H 7/0838 318/490 |
| 2015/0340977 A1* | 11/2015 | Tateda | H02M 1/32 318/400.21 |

FOREIGN PATENT DOCUMENTS

| | | | | |
|---|---|---|---|---|
| AT | 406620 B | * | 5/2000 | ........... G01R 31/025 |
| EP | 3 306 813 A1 | | 4/2018 | |

(Continued)

OTHER PUBLICATIONS

International Search Report (PCT/ISA/210) issued in PCT Application No. PCT/JP2019/027593 dated Aug. 6, 2019 with English translation (four (4) pages).
(Continued)

*Primary Examiner* — Kevin J Comber
(74) *Attorney, Agent, or Firm* — Crowell & Moring LLP

(57) ABSTRACT

A power-conversion device and a ground-fault-location-diagnosis method for determining ground-fault locations on a motor and a cable are disclosed. The power-conversion device includes a ground-fault-current-measurement unit, an interphase short-circuit current-measurement unit, and a ground-fault-location-determination unit. The ground-fault-current-measurement unit turns on all switches of either upper arms or lower arms of three half-bridge circuits, and measures output current values of a plurality of phases generated during the ON period. The interphase short-circuit-current-measurement unit turns on a switch of an upper arm of one phase of the three half-bridge circuits and
(Continued)

a switch of a lower arm of a phase different from the one phase, and measures output current values of a plurality of phases generated during a period of time both switches are ON. The ground-fault-location-determination unit determines a ground-fault location based on output-current values measured by the ground-fault-current-measurement unit and the output-current values measured by the interphase short-circuit current-measurement unit.

15 Claims, 12 Drawing Sheets

(51) Int. Cl.
  *H02H 3/16* (2006.01)
  *H02H 7/08* (2006.01)
  *H02M 1/32* (2007.01)
(58) Field of Classification Search
  USPC .......................................................... 361/42
  See application file for complete search history.

(56) References Cited

FOREIGN PATENT DOCUMENTS

| | | | | | |
|---|---|---|---|---|---|
| EP | 3 477 843 | A1 | | 5/2019 | |
| JP | 8-308244 | A | | 11/1996 | |
| JP | 08308244 | A | * | 11/1996 | |
| JP | 2011-217518 | A | | 10/2011 | |
| JP | 2015-223050 | A | | 12/2015 | |
| JP | 2016-226243 | A | | 12/2016 | |
| JP | 2017051047 | A | * | 3/2017 | |
| JP | 2017-229172 | A | | 12/2017 | |
| JP | 2017229172 | A | * | 12/2017 | ......... G01R 27/2611 |
| WO | WO-2016194399 | A1 | * | 12/2016 | ........... G01R 31/025 |
| WO | WO 2017/221453 | A1 | | 12/2017 | |

OTHER PUBLICATIONS

Japanese-language Written Opinion (PCT/ISA/237) issued in PCT Application No. PCT/JP2019/027593 dated Aug. 6, 2019 (three (3) pages).

Extended European Search Report issued in European Application No. 19844673.4 dated Jan. 24, 2022 (ten (10) pages).

* cited by examiner

FIG. 7

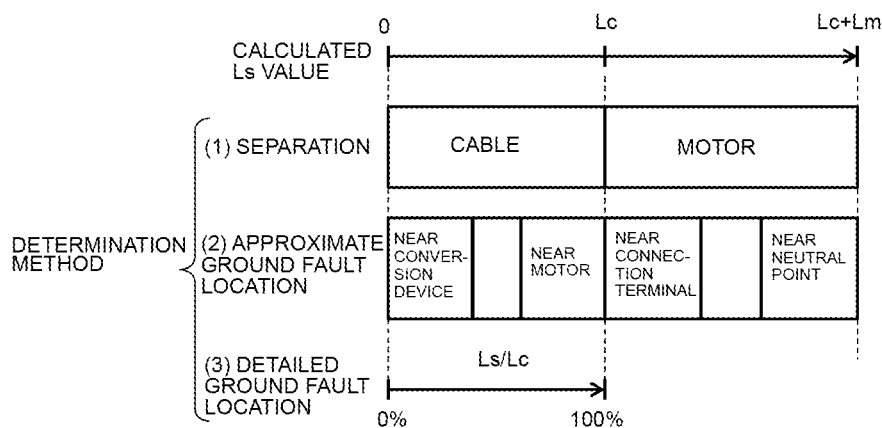

FIG. 8A

| (A) CODE | (B) LED DISPLAY | (C) GROUND FAULT LOCATION INFORMATION |
|---|---|---|
| A1 | A1 | GROUND FAULT PHASE U PHASE |
| A2 | A2 | GROUND FAULT PHASE V PHASE |
| A3 | A3 | GROUND FAULT PHASE W PHASE |
| A4 | A4 | GROUND FAULT PHASE U PHASE & V PHASE |
| A5 | A5 | GROUND FAULT PHASE V PHASE & W PHASE |
| A6 | A6 | GROUND FAULT PHASE U PHASE & W PHASE |
| A7 | A7 | GROUND FAULT PHASE U PHASE & V PHASE & W PHASE |

FIG. 8B

| (A) CODE | (B) LED DISPLAY | (C) GROUND FAULT LOCATION INFORMATION |
|---|---|---|
| b1 | b1 | ON CABLE AND NEAR INVERTER |
| b2 | b2 | ON CABLE AND NEAR MOTOR |
| b3 | b3 | NEAR TERMINAL INSIDE MOTOR |
| b4 | b4 | NEAR NEUTRAL POINT INSIDE MOTOR |

FIG. 8C

| (A) CODE | (B) LED DISPLAY | (C) GROUND FAULT LOCATION INFORMATION |
|---|---|---|
| 00 ~ 99 | 00 ~ 99 | DISTANCE (m) FROM INVERTER |

POWER CONVERSION DEVICE AND GROUND FAULT LOCATION DIAGNOSIS METHOD

TECHNICAL FIELD

The present invention relates to a power conversion device and a ground fault location diagnosis method.

BACKGROUND ART

A configuration diagram showing a conventional power conversion device, a motor, and a cable connecting these to each other is shown in FIG. 17. In FIG. 17, a conventional power conversion device 581 includes a forward converter circuit 582, a smoothing capacitor 583, and an inverse converter circuit 584 for supplying power to a motor with AC power as an input. The forward converter circuit 582 is configured to include six diodes, and converts the AC power input from input terminals R, S, and T into DC power. The smoothing capacitor 583 is connected to DC voltage wirings inside the power conversion device to smooth a voltage between the wirings. The inverse converter circuit 584 converts the DC power into AC power for driving the motor and outputs the AC power to output terminals U, V, and W. The inverse converter circuit 584 includes switches 585a to 595f formed of semiconductors, two switches are paired to form a half-bridge circuit, and the six switches form a three-phase bridge circuit of U, V, and W. Switching is performed by alternately turning on switching elements for one phase so that the upper and lower switching elements are not turned on at the same time. The output terminals U, V, and W of the respective phases are connected to a motor 587 using three cables 586. The conventional power conversion device 581 controls the power supplied to the motor by PWM control to change the time when each switch is turned on, based on current information observed by current sensors 588u and 588w or a current sensor 588n.

When a short circuit or a ground fault occurs inside the motor 587 or in the cable 586 due to some cause such as deterioration of insulation coating or physical damage, an overcurrent is detected by the current sensor 588n or an overcurrent detection circuit 589a that is attached between the emitter and the collector of each switch and monitors the collector voltage to detect an overcurrent (in FIG. 17, only the overcurrent detection circuit attached to the switch 585a is shown. The description of the switches 585b to 585f is omitted.). In addition, when an overcurrent is detected, the conversion operation is stopped by turning off all the switching elements, so that the switching elements are prevented from being damaged by thermal energy generated by the large current.

When the operation of the power conversion device is stopped due to a short circuit between wirings or a ground fault, the occurrence of the ground fault can be known by notifying the user of the information. However, when the operation of the power conversion device is stopped due to the occurrence of a short circuit and a ground fault, there is a problem that the user cannot specify whether the short circuit or the ground fault has occurred on the cable or inside the motor and where the short circuit or the ground fault has occurred on the cable.

Patent Document 1 is a prior art of how to know the information of an abnormality occurrence location. As shown in FIG. 18, Patent Document 1 discloses a method of estimating a ground fault location from the ratio between the current of the ground fault phase and the current of the non-ground fault phase when all the switches of the upper arms or the lower arms are turned on to make the ground fault current flow. This method uses a principle that the ratio between the two current values is determined by the inductance of the motor cable and the windings in the motor.

CITATION LIST

Patent Document

Patent Document 1: JP 2017-229172 A

SUMMARY OF THE INVENTION

Problems to be Solved by the Invention

However, Patent Document 1 is a method assuming a case where only one phase has a ground fault, and does not correspond to a case where a plurality of phases have ground faults at locations close to each other. In particular, in the case of ground faults of three phases (all phases), there is no non-ground fault phase shown in FIG. 18, so that the ground fault location cannot be estimated based on the current ratio, which is the principle shown in Patent Document 1.

The present invention has been made in view of such a problem, and it is an object of the present invention to provide a power conversion device and a ground fault location diagnosis method for determining ground fault locations on a motor and a cable and notifying a user or an external device or system of a determination result even when ground faults of a plurality of phases occur at locations close to each other.

Solutions to Problems

In view of the above background art and problems, as an example of the present invention, a power conversion device that includes a plurality of switches formed of semiconductors and drives a three-phase motor connected by a three-phase cable by controlling ON/OFF of the switches includes: a forward converter circuit that is configured to include diodes and converts AC power from a power source into DC power; an inverse converter circuit configured to include three half- bridge circuits for controlling a current supplied to the motor; a plurality of driver circuits for driving the plurality of switches forming the half-bridge circuits; a control circuit for controlling the driver circuits; and an information output means for providing notification of an internal state of the device to an outside. The control circuit includes a ground fault current measurement unit, an interphase short-circuit current measurement unit, and a ground fault location determination unit. When investigating a location of a ground fault occurring in the cable and the motor, the ground fault current measurement unit turns on all the switches of either upper arms or lower arms of the three half-bridge circuits, and measures output current values of a plurality of phases generated during the ON period. The interphase short-circuit current measurement unit turns on a switch of an upper arm of one phase of the three half-bridge circuits and a switch of a lower arm of a phase different from the one phase, and measures output current values of a plurality of phases generated during a period of time for which both the switches are ON. The ground fault location determination unit determines a ground fault location based on the output current values measured by the ground fault current measurement unit and the output current values measured by the interphase short-circuit current measurement unit.

Effects of the Invention

According to the present invention, even when ground faults of a plurality of phases occur at locations close to each other, it is possible to determine the ground fault locations on the motor and the cable and notify the user or the external device or system of the determination result.

BRIEF DESCRIPTION OF THE DRAWINGS

FIG. 7 is a diagram showing a ground fault location diagnosis method used by a ground fault location determination unit 123 in FIG. 1.

FIGS. 8A to 8C are correspondence tables between a display pattern displayed on an LED segment and a ground fault location when a display device is an LED.

MODE FOR CARRYING OUT THE INVENTION

Hereinafter, embodiments of the present invention will be described with reference to the diagrams.

First Embodiment

Figure 1:
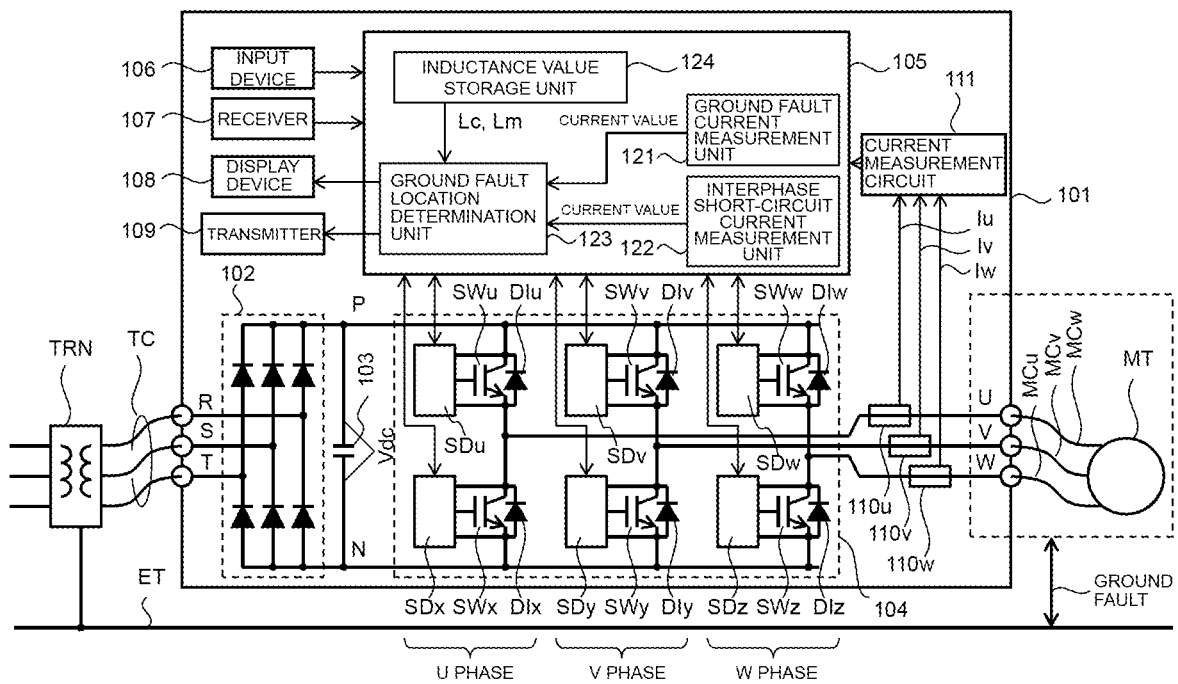
FIG. 1 is a configuration diagram of a power conversion device according to a first embodiment.

FIG. 1 is a configuration diagram of a power conversion device according to the present embodiment. In FIG. 1, the power conversion device can estimate the location of a ground fault when a ground fault occurs between motor cables MCu, MCv, and MCw or a three-phase motor MT surrounded by the broken line and the earth ET.

The three motor cables MCu, MCv, and MCw are connected to output terminals U, V, and W of a power conversion device 101, and the three-phase motor MT is connected to the tips of the three motor cables MCu, MCv, and MCw. On the other hand, three power cables TC are connected to input terminals R, S, and T of the power conversion device 101, and the tips of the three power cables TC are connected to the secondary side of a transformer TRN. Either the inside of the transformer TRN or the power cable TC is connected to the earth ET or the grounded wiring.

The power conversion device 101 includes a forward converter circuit 102, a smoothing capacitor 103, and an inverse converter circuit 104 for supplying power to a motor with AC power as an input. In addition, the power conversion device 101 includes a control circuit 105 for controlling the inverse converter circuit 104, an input device 106 for manually inputting information to the control circuit 105, a receiver 107 for receiving information from an external system, a display device 108 for displaying output information from the control circuit 105, and a transmitter 109 for transmitting information to the external system.

The forward converter circuit 102 is configured to include six diodes, and converts the AC power input from the input terminals R, S, and T into DC power and outputs the DC power to both electrodes of the smoothing capacitor 103. Due to the rectifying action of the diode of the forward converter circuit 102, a DC voltage Vdc having a positive voltage on the DC voltage wiring on a node P side and a negative voltage on the DC voltage wiring on a node N side is generated. The smoothing capacitor 103 is connected to the DC voltage wiring at the nodes P and N to smooth the voltage between the wirings. The inverse converter circuit 104 converts the DC power into AC power for driving the motor and outputs the AC power to the output terminals U, V, and W.

The inverse converter circuit 104 is configured to include three half-bridge circuits of U phase, V phase, and W phase. The U-phase half-bridge circuit is configured to include an upper arm in which a switch SWu and a diode DIu are connected in antiparallel to each other and a lower arm in which a switch SWx and a diode DIx are connected in antiparallel to each other. Similarly, the V-phase half-bridge circuit is configured to include a switch SWv and a diode DIv and a switch SWy and a diode DIy, and the W-phase half-bridge circuit is configured to include a switch SWw and a diode DIw and a switch SWz and a diode DIz. Although an IGBT is used as a switch in FIG. 1, a MOSFET may be used. In addition, although silicon is generally used for the semiconductor device, SiC (silicon carbide) or GaN (gallium nitride), which is a wide-gap semiconductor, may be used in order to reduce the loss. Switch driver circuits SDu, SDv, SDw, SDx, SDy, and SDz are connected to all the switches SWu, SWv, SWw, SWx, SWy, and SWz, respectively, and each switch driver circuit is connected to each electrode of an emitter, a gate, and a collector of each switch. The emitter, the gate, and the collector are the electrode names of the IGBT. In the case of a MOSFET, these correspond to the electrode names of a source, a gate, and a drain. A gate driver circuit for switching ON and OFF of the switch by controlling the gate voltage of the switch and an overcurrent protection circuit for detecting that an overcurrent has flowed through the switch and turning off the switch at high speed are built in all the switch driver circuits. Each switch driver circuit has a means for communication with the control circuit 105, and the communication means is used to transmit an ON/OFF control signal of the switch from the control circuit 105 to the switch driver circuit and transmit an overcurrent detection signal from the switch driver circuit to the control circuit 105.

The power conversion device 101 includes three current sensors 110u, 110v, and 110w for measuring the output current value of each phase and a current measurement circuit 111 for measuring the measurement values of the current sensors 110u, 110v, and 110w between the inverse converter circuit 104 and the output terminals U, V, and W. The current sensors 110u, 110v, and 110w measure current values Iu, Iv, and Iw output from the output terminals U, V, and W and transmit the measured current values Iu, Iv, and Iw to the current measurement circuit 111 as analog voltages or currents. The current measurement circuit 111 samples the analog information, converts the sampled analog information into digital data, and transmits the digital data to the control circuit 105. The current measurement circuit 111 can be configured by a general sampling circuit and a general A/D conversion circuit.

The control circuit 105 includes a ground fault current measurement unit 121, an interphase short-circuit current measurement unit 122, a ground fault location determination unit 123, and an inductance value storage unit 124. When investigating the ground fault location, the ground fault current measurement unit 121 turns on either all the switches (SWu, SWv, and SWw) of the upper arms or all the switches (SWx, SWy, and SWz) of the lower arms, acquires current value information of the ground fault current generated at that time from the current measurement circuit 111, and transmits the measured current values of the U, V, and W phases to the ground fault location determination unit 123. The interphase short-circuit current measurement unit 122 turns on one (SWu, SWv, or SWw) of the switches of the upper arms and one (SWx, SWy, or SWz) of the switches of the lower arms having a different phase, acquires current value information of the interphase short-circuit current generated at that time from the current measurement circuit 111, and transmits the measured current value information of the interphase short- circuit current to the ground fault location determination unit 123. The ground fault location determination unit 123 calculates an inductance value of the motor cable or the wiring inside the motor from the power conversion device 101 to the ground fault location based on the measured current value information of the ground fault current and the interphase short-circuit current, determines the ground fault location by comparing the inductance value Lc of the motor cable MC stored in the inductance value storage unit 124 with the inductance value Lm of the winding inside the motor, and transmits the determination result to the display device 108 and the transmitter 109.

In addition, although the control circuit 105 has a general function for PWM driving of the motor, the description thereof will be omitted because this is not relevant to the operation of the present invention. In addition, elements that can be configured only by logic circuits, such as the ground fault current measurement unit 121, the interphase short-circuit current measurement unit 122, the ground fault location determination unit 123, and the inductance value storage unit 124 in the control circuit 105, can also be realized by software using a microcomputer or a programmable logic.

Figure 2:
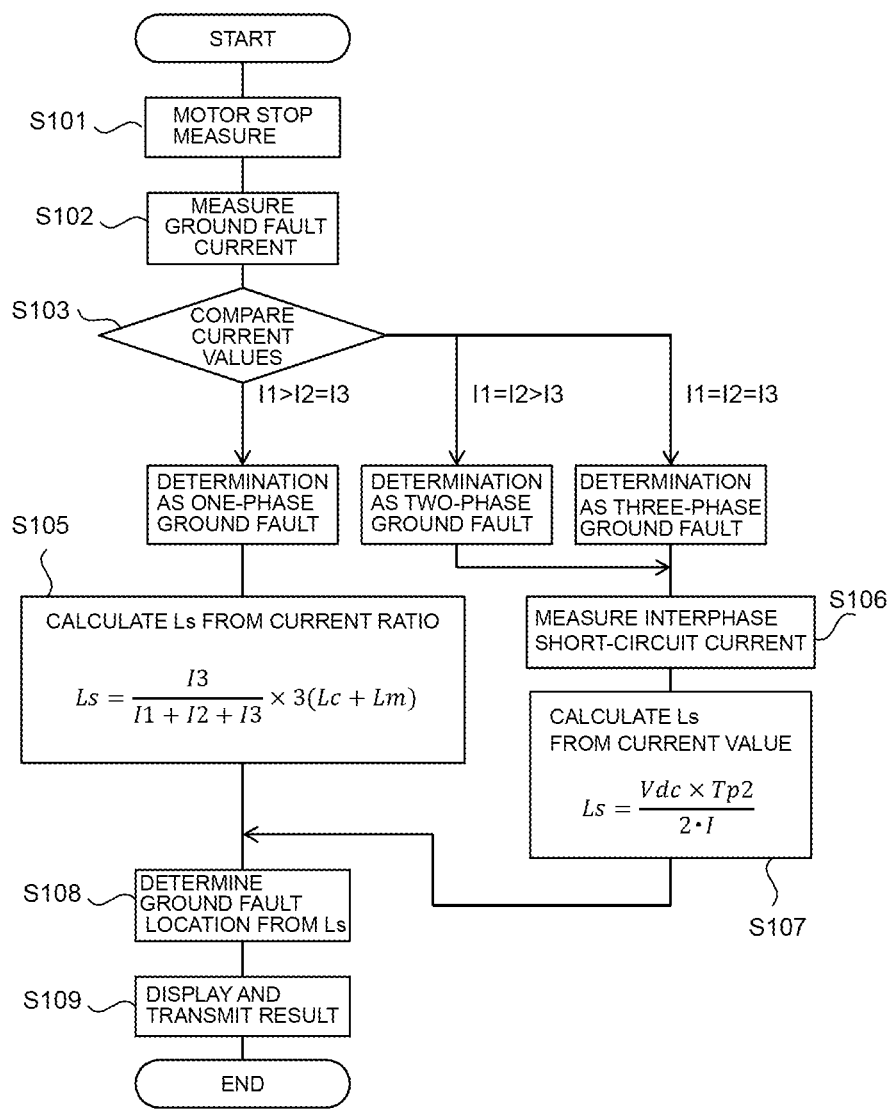
FIG. 2 is a flowchart for determining a ground fault location according to the first embodiment.

FIG. 2 shows a flowchart for determining a ground fault location of according to the present embodiment. The flowchart of FIG. 2 is started by an overcurrent detection signal by a protection circuit due to the occurrence of a ground fault and a trigger from the input device 106 or the receiver 107. In FIG. 2, after the start, the control circuit 105 performs a motor stop measure (S101). Specifically, the control circuit 105 turns off all the switches of the inverse converter circuit 104 to stop the supply of power to the motor, and waits until the current values of all the phases measured by the current measurement circuit 111 become 0.

After the motor is stopped, the ground fault current measurement unit 121 measures the ground fault current (S102). The ground fault current measurement unit turns on all the switches (SWu, SWv, and SWw) of the upper arms or all the switches (SWx, SWy, and SWz) of the lower arms for a predetermined period of time. At this time, the current sensors 110u, 110v, and 110w and the current measurement circuit 111 measure the output current values of the U phase, the V phase, and the W phase and transmit the measured output current values to the ground fault current measurement unit 121.

FIG. 3 shows a current path when a ground fault short-circuit current is generated in the ground fault current measurement step S102 in FIG. 2. In FIG. 3, (a) shows a case where a one-phase ground fault (W phase is a ground fault) occurs on the motor cable, (b) shows a case where a ground fault (V phase and W phase are ground faults) occurs at locations close to each other in the longitudinal direction of the two-phase cable, and (c) shows a case where a ground fault occurs at locations close to each other in the longitudinal direction of the three-phase cable.

Figure 3A:
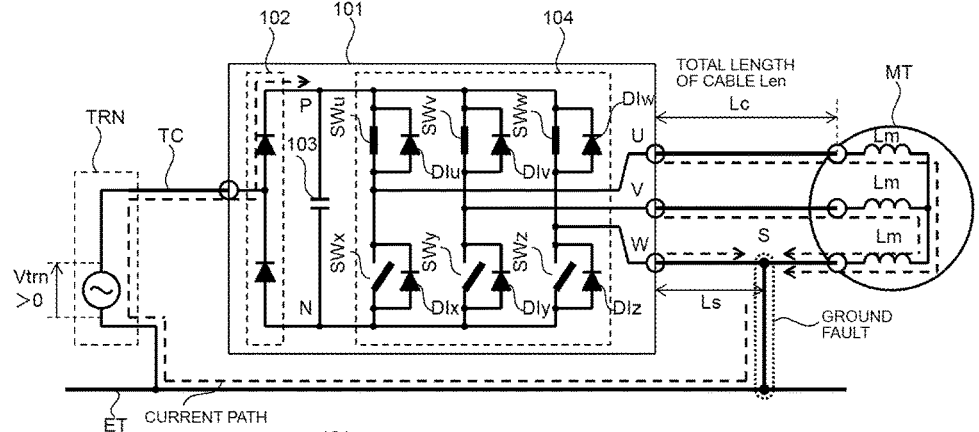
FIGS. 3A to 3C are diagrams showing a current path when a ground fault short-circuit current is generated in ground fault current measurement step S102 in FIG. 2.
Figure 3B:
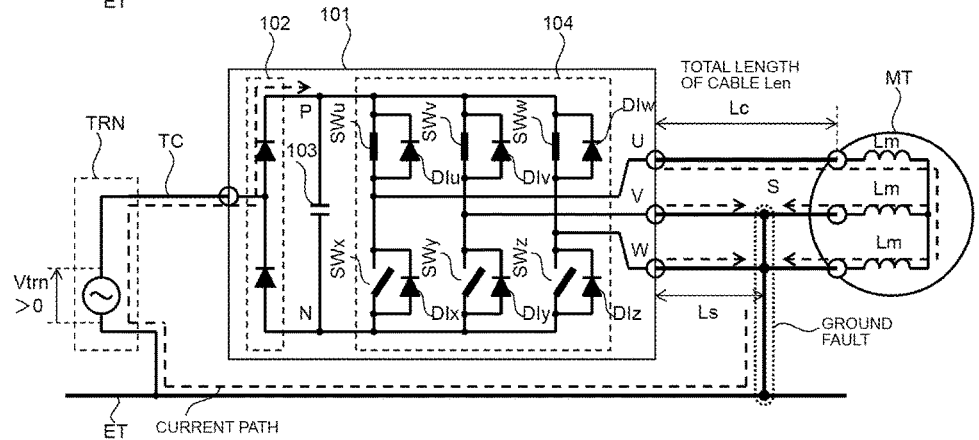
Figure 3C:
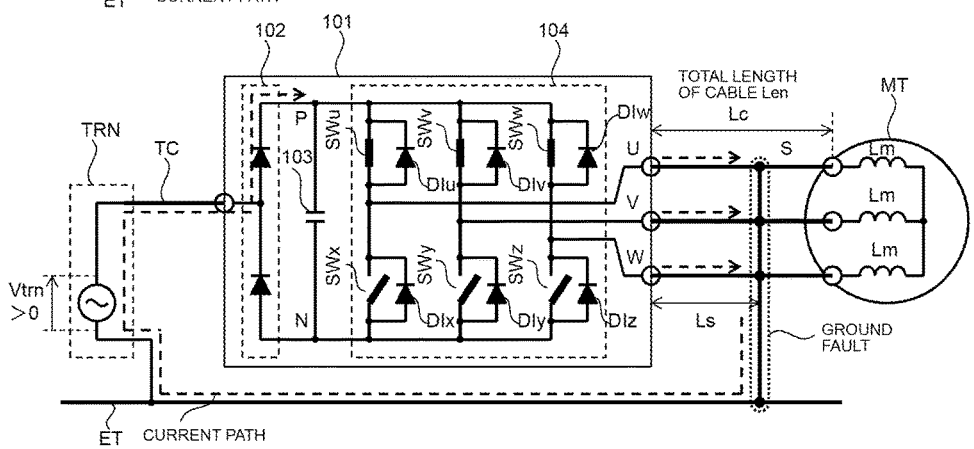

In FIG. 3, the electromotive force for generating the current is a voltage to ground Vtrn of the output (secondary side) of the transformer. The output of the transformer has three phases, but the current flows from the phase in which the voltage to ground Vtrn is positive by the diode of the forward converter circuit 102. When there are a plurality of phases in which the voltage to ground Vtrn is positive, the current flows from the plurality of phases. In FIGS. 3(a) to 3(c), however, for simplification of the description, the transformer TRN, the power cable TC, and the diode of the forward converter circuit 102 are shown for only one phase. The current that is supplied from the transformer TRN and flows through the diode of the forward converter circuit 102 passes through the node P to be divided into three currents through the switches SWu, SWv, and SWw of the three upper arms in the inverse converter circuit 104 in the ON state. The divided currents merge at a ground fault location S through the output terminals U, V, and W. The merged current flows through the earth ET to returns to the transformer TRN.

Each inductance component present in the current path from the output terminals U, V, and W of the power conversion device 101 to a ground fault location S has a different value depending on the number of short-circuit phases for the following reasons. In the following description, it is assumed that the inductance of a motor cable having a total length of Len is Lc, the inductance of the motor winding of each phase is Lm, and the inductance of a cable from one output of the phase in which ground fault occurs to the ground fault location S is Ls, and the inductances of a motor cable from the output terminals U, V, and W of the power conversion device 101 to the ground fault location S are Lu, Lv, and Lw.

In the case of the one-phase ground fault in FIG. 3(*a*), Lw=Ls in a phase in which a ground fault occurs (W phase), and Lu=Lv=(Lc+Lm)+2(Lm+Lc−Ls)=3(Lm+Lc)−2Ls in a phase in which no ground fault occurs (U phase and V phase) (the reason why 2(Lm+Lc−Ls) is used is that twice the current flows through the portion).

In the case of the two-phase ground fault shown in FIG. 3(*b*), Lv=Lw=Ls in a phase in which a ground fault occurs (V phase and W phase), and Lu=(Lc+Lm)+0.5(Lm+Lc−Ls)=1.5(Lm+Lc)−0.5Ls in a phase in which no ground fault occurs (U phase) (the reason why 0.5(Lm+Lc−Ls) is used is that the current is divided in half at the portion).

In the case of the three-phase ground fault shown in FIG. 3(*c*), Lu=Lv=Lw=Ls.

Incidentally, when the voltage to ground Vtrn is negative, all the switches (SWx, SWy, and SWz) of the lower arms are turned on instead of turning on all the switches (SWu, SWv, and SWw) of the upper arms. In this case, the ground fault current path in FIG. 3 becomes a path in which the current is distributed and flows from the node N to SWx, SWy, and SWz instead of a path in which the current is distributed and flows from the node P to SWu, SWv, and SWw. As a result, the other current paths are the same as those in FIG. 3, except that the current directions are opposite. In addition, when the current directions are opposite directions, the current value is measured as a negative value in a normal current sensor. However, since the current direction is not important in the description of the embodiment of the present invention, all are treated as positive (absolute value).

Figure 4:
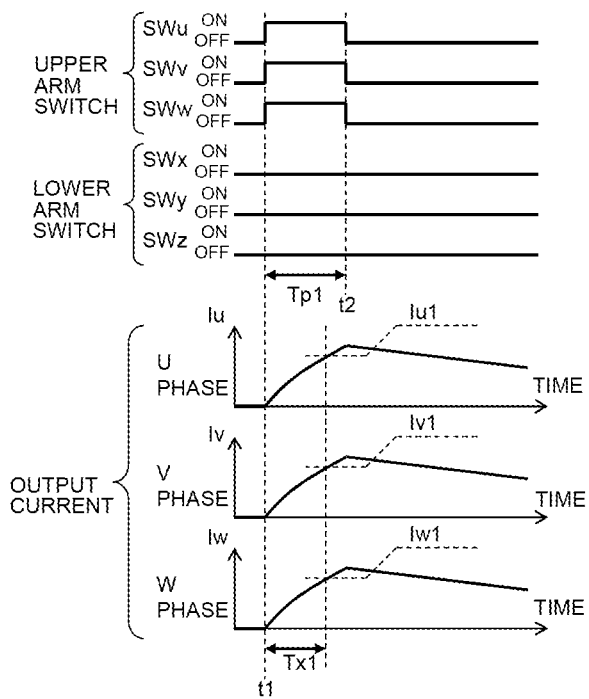
FIG. 4 is a diagram showing a driving pattern example of each switch and a current waveform generated at each phase output at that time in the ground fault current measurement step S102 in FIG. 2.

FIG. 4 shows a driving pattern example of each switch and a current waveform generated at each phase output at that time in the ground fault current measurement step S102 in FIG. 2. In FIG. 4, the upper arm switches SWu, SWv, and SWw are turned on at time t1, and then the upper arm switches SWu, SWv, and SWw are turned off at time t2. A ground fault current is generated during a period of time Tp1 from time t1 to time t2, which causes a current to be generated at the U-phase, V-phase, and W-phase outputs. The current sensors 110*u*, 110*v*, and 110*w* and the current measurement circuit 111 measure the output current at a time when time Tx1 not exceeding the time t2 has passed from the time t1, and transmit measured current values Iu1, Iv1, and Iw1 to the ground fault current measurement unit 121. The magnitude relationship among the current values Iu1, Iv1, and Iw1 measured at this time differs depending on the number of phases in which a ground fault has occurred. The reason is that the above-described division ratio of the ground fault current is determined by the inductances Lu, Lv, and Lw.

Comparing the current values Iu1, Iv1, and Iw1, Iu1=Iv1<Iw1 in the case of FIG. 3(*a*) that is a one-phase ground fault, and Iu1<Iv1=Iw1 in the case of FIG. 3(*b*) that is a two-phase ground fault, and Iu1=Iv1=Iw1 in the case of FIG. 3(*c*) that is a three-phase ground fault. In addition, the measurement timing of the output current of the current measurement circuit 111 has been described as being performed at a time not exceeding the time t2 from the time t1. However, even at the same time as or immediately after the time t2 at which the upper arm switches SWu, SWv, and SWw are turned off in a strict sense, the ground fault current in a transient state flows, so that it is possible to measure the ground fault current generated during the period of time for which the upper arm switches SWu, SWv, and SWw are ON.

Here, the description returns to the flowchart of FIG. 2. After the ground fault current measurement S102, the ground fault location determination unit 123 compares the current values (S103). Before the comparison, the three current values of Iu1, Iv1, and Iw1 are sorted, and I1, I2, and I3 are set in descending order. If I2 and I3 are about the same and I1 is larger than I2 and I3, the ground fault location determination unit 123 determines that the ground fault is one phase. In addition, if I1 and I2 are about the same and are larger than I3, it is determined that the ground fault is two phases. In addition, if I1 to I3 are about the same, it is determined that the ground fault is three phases.

When determination as a one-phase ground fault is made in the current value comparison S103, the inductance Ls of the motor cable from the power conversion device 101 to the ground fault location S is calculated from the current ratio (S105). The inductance Ls can be calculated by Equation (1).

$$Ls = I3/(I1+I2+I3) \cdot 3 \cdot (Lc+Lm) \quad (1)$$

Here, Lc is the inductance of the entire length of the motor cable, and Lm is the inductance of the winding in the motor. In addition, in the case of a one-phase ground fault, since I2=I3, it can also be calculated by the equation (2).

$$Ls = I2/(I1+2 \cdot I2) \cdot 3 \cdot (Lc+Lm) \quad (2)$$

The procedure for deriving Equations (1) and (2) will be described below. Since I1 is a ground fault phase current, I1 is expressed by I1=(∫Vtrn·dt)/Ls at times t1 to t2. In addition, since I2 and I3 are non-ground fault phase currents, I2 and I3 are expressed by I2=I3=(∫Vtrn·dt)/(3(Lm+Lc)−2Ls) at times t1 to t2. The inductances of these two equations are the inductance of the current path of the ground fault phase and the inductance of the current path of the non-ground fault phase in the case of the one-phase ground fault described above (FIG. 3(*a*)). By eliminating (∫Vtrn·dt) from these two equations, Equations (1) and (2) are obtained.

On the other hand, when determination as a two-phase ground fault or a three-phase ground fault is made in the current value comparison of S103, the interphase short-circuit current measurement unit 122 performs interphase short-circuit current measurement (S106).

Figure 5:
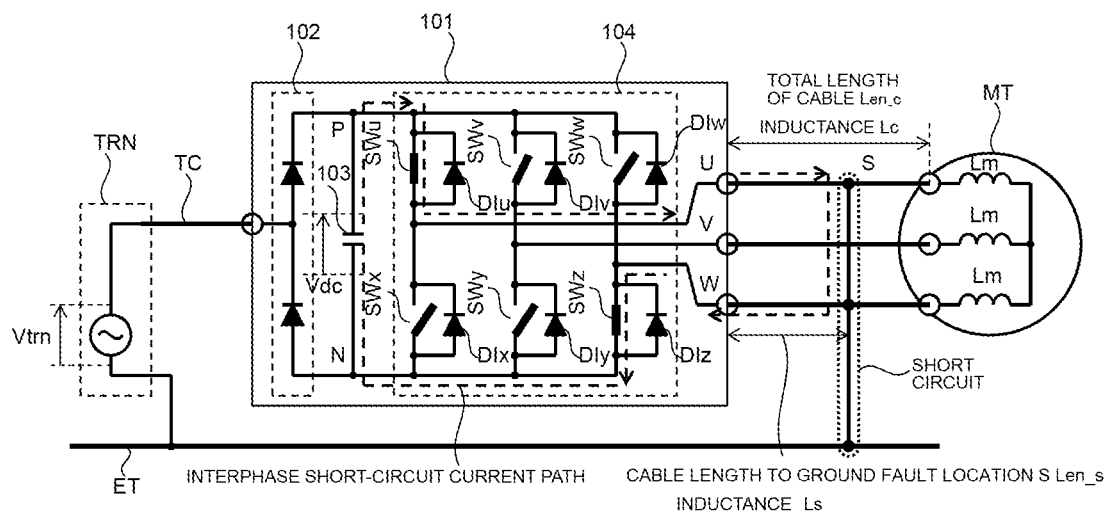
FIG. 5 is a diagram showing a current path when an interphase short-circuit current is generated in interphase short-circuit current measurement step S106 in FIG. 2.

FIG. 5 shows a current path when an interphase short-circuit current is generated in the interphase short-circuit current measurement step S106 in FIG. 2. In the interphase short-circuit current measurement S106, the switch of the upper arm of one phase and the switch of the lower arm of another phase different from the one phase are turned on to generate an interphase short-circuit current. When determination as a two-phase ground fault is made, of the two phases determined to be a ground fault by the current value comparison S103, the switch of the upper arm of one phase and the switch of the lower arm of the other phase are turned on. On the other hand, when determination as a three-phase ground fault is made, the same applies to any two phases. Then, an interphase short-circuit current is generated in the path indicated by the broken line in the diagram. FIG. 5 shows, as an example, a case where two phases of the U phase and the W phase have a ground fault at locations close to each other.

The electromotive force for generating the interphase short-circuit current is the DC voltage Vdc held by the smoothing capacitor 103. The current supplied from the smoothing capacitor 103 flows into the phase (U phase) in which a ground fault occurs through the node P and the switch of the upper arm. The current flows into another phase (W phase) in which a ground fault occurs at the ground fault location S, and returns to the smoothing capacitor 103 through the node N. Moreover, in addition to the broken line, a ground fault current is generated using the voltage to ground Vtrn of the output (secondary side) of the transformer as an electromotive force. In general, however, since the inductance of the ground fault current path is sufficiently larger than the inductance of the interphase short circuit path, the effect of the ground fault current can be neglected.

Figure 6:
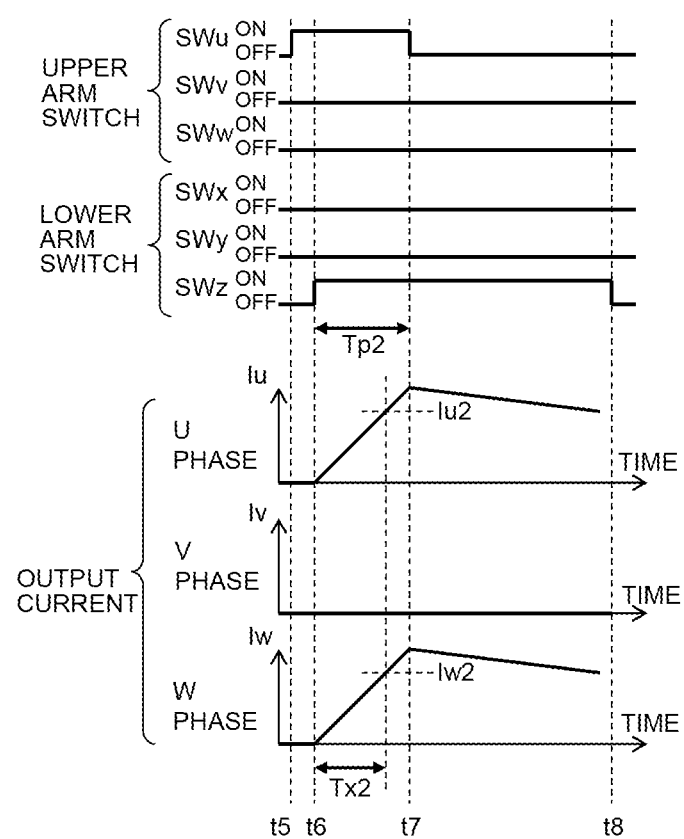
FIG. 6 is a diagram showing a driving pattern example of each switch and a current waveform generated at each phase output at that time in the interphase short-circuit current measurement step S106 in FIG. 2.

FIG. 6 shows a driving pattern example of each switch and a current waveform generated at each phase output at that time in the interphase short-circuit current measurement step S106 in FIG. 2. In FIG. 6, the switch SWu of the upper arm and the switch SWz of the lower arm are sequentially turned on at time t5 and time t6. Thereafter, the switch SWu of the upper arm is turned off at time t7, and the switch SWz of the lower arm is turned off at time t8. An interphase short-circuit current is generated during a time Tp2 for which both the two switches SWu and SWz are ON, so that a current is generated at the outputs of the two phases (U phase and W phase). After a time Tx2 not exceeding the time t7 has passed from the time t6 when the above two switches are turned on, the current sensors 110$u$ and 110$w$ and the current measurement circuit 111 measure the output current, and the measured current values Iu2 and Iw2 are transmitted to the interphase short-circuit current measurement unit 122. In addition, even at the same time as or immediately after the time t7 in a strict sense, the interphase short-circuit current in a transient state flows, so that it is possible to measure the interphase short-circuit current generated during the period of time for which the two switches SWu and SWz are ON.

Incidentally, assuming that the amount of interphase short-circuit current is I, I is expressed by Equation (3).

$$I=(\int[\text{integral range } t6 \text{ to } t6+Tx2]Vdc \cdot dt)/(2Ls) \quad (3)$$

Here, tx is the elapsed time since both the above switches were turned on, Vds is a voltage between the terminals of the smoothing capacitor 103, and Ls is the inductance of the current path from the output terminal U of the power conversion device 101 to the ground fault location S and from the output terminal W to the ground fault location S.

When the capacitance of the smoothing capacitor 103 is made to be sufficiently large so that Vdc does not change due to the generation of an interphase short-circuit current, the relationship between Ls and I is expressed by Equation (4).

$$Ls=(Vdc \cdot Tx2)/(2 \cdot I) \quad (4)$$

Here, the description returns to the flowchart of FIG. 2. After the interphase current measurement S106 described above, the inductance Ls of the motor cable from the power conversion device 101 to the ground fault location S is calculated using Equation (3) or linear and easy-to-use Equation (4) (S107). The current value measured in the ground fault phase is substituted for the current I.

The ground fault location is determined from the inductance Ls obtained by the step S105 for calculating Ls from the current ratio and the step S107 for calculating Ls from the current value and the values of Lc and Lm stored in the inductance value storage unit 124 (S108). Thereafter, the determination result is transmitted to the display device 108 and the transmitter 109 (S109), and the flow of determining the ground fault location ends.

FIG. 7 shows a ground fault location diagnosis method used by the ground fault location determination unit 123 in the control circuit 105. The ground fault location determination unit 123 converts the calculated Ls into ground fault location determination information. FIG. 7 shows three determination method examples. The determination method (1) is a method of determining whether the ground fault location is on the motor cable or inside the motor. This is a method in which a ground fault has occurred on the motor cable when the calculated Ls is smaller than the inductance value Lc of the motor cable and a ground fault has occurred inside the motor when the calculated Ls is larger than the inductance value Lc of the motor cable. The determination method (2) is a method of determining an approximate ground fault location on the motor cable and inside the motor. This is a method in which it is determined that a ground fault has occurred in the vicinity of the power conversion device when the calculated Ls is close to 0, a ground fault has occurred on the cable near the motor when the calculated Ls is close to Lc and slightly smaller than Lc, a ground fault has occurred in the vicinity of the connection terminal inside the motor when the calculated Ls is close to Lc and slightly larger than Lc, and a ground fault has occurred in the vicinity of the neutral point inside the motor when the calculated Ls is close to Lc+Lm and slightly smaller than Lc+Lm. The determination method (3) is a method of determining the ground fault location on the motor cable in detail. This is a method of determining at what percentage of the total length of the motor cable from the power conversion device a ground fault is present based on the value of Ls/Lc when it is assumed that the total length of the motor cable is 100%.

Lc and Lm stored in the inductance value storage unit 124 are input in advance from the input device 106 or the receiver 107. Instead of inputting the inductance value Lc of the motor cable, a means for inputting the cable length Len and cable type of the motor cable used and calculating the inductance value Lm from the cable length Len using the proportional coefficient corresponding to the cable type is also possible. In addition, instead of inputting the inductance value Lm of the winding inside the motor, there is also a means for acquiring the inductance value Lm+Lc by the auto-tuning operation at the time of normal motor driving and calculating Lm by subtracting Lc from Lm+Lc.

The display device 108 shown in FIG. 1 is configured to include, for example, a decoder, an LED driver, and a 2-digit display LED segment. The ground fault location determination result transmitted from the control circuit 105 is decoded by the decoder into the display patterns of the numbers and characters of the LED segment. The LED driver displays the decoded display patterns on the LED segment by the current signal.

FIG. 8 shows a correspondence table between the display pattern displayed on the LED segment and the ground fault location. In FIG. 8, (B) display pattern represents (A) code with a 7-segment LED. FIG. 8($a$) shows a case where information of ground fault phases is displayed. Codes A1 to A7 indicate the presence or absence of a ground fault in each of the U phase, V phase, and W phase. FIG. 8($b$) shows a case where rough information of a ground fault is displayed. Code b1 indicates that the ground fault location is near the inverter of the motor cable, code b2 indicates that the ground fault location is near the motor of the motor cable, code b3 indicates that the ground fault location is near the terminal on the motor winding, and code b4 indicates that the ground fault location is near the neutral point on the motor winding. FIG. 8($c$) shows a case where the distance (unit: meter) of a short-circuit location on the motor cable from the inverter is expressed by numerical values 00 to 99. By posting the correspondence table of FIG. 8 on the manual of the power conversion device or on the side surface of the power conversion device, the user can easily grasp the correspondence between the codes and the ground fault location information.

The transmitter 109 shown in FIG. 1 is configured to include, for example, a modulator, an amplifier, and an antenna. The ground fault location determination result transmitted from the control circuit 105 is modulated by the modulator, power-amplified by the amplifier, and wirelessly transmitted to the outside through the antenna. Although not shown, another device or system can acquire the information of the short-circuit phase number and the ground fault location determination result by receiving and demodulating the wirelessly transmitted signal. In addition, by using the tablet type terminal and installing the application software having the correspondence table of FIG. 8 into the tablet type terminal, the ground fault location information can be displayed on the screen of the tablet type terminal.

As described above, according to the present embodiment, even when ground faults of a plurality of phases occur at locations close to each other, it is possible to determine the ground fault locations on the motor and the cable and notify the user or the external device or system of the determination result.

Second Embodiment

Figure 9:
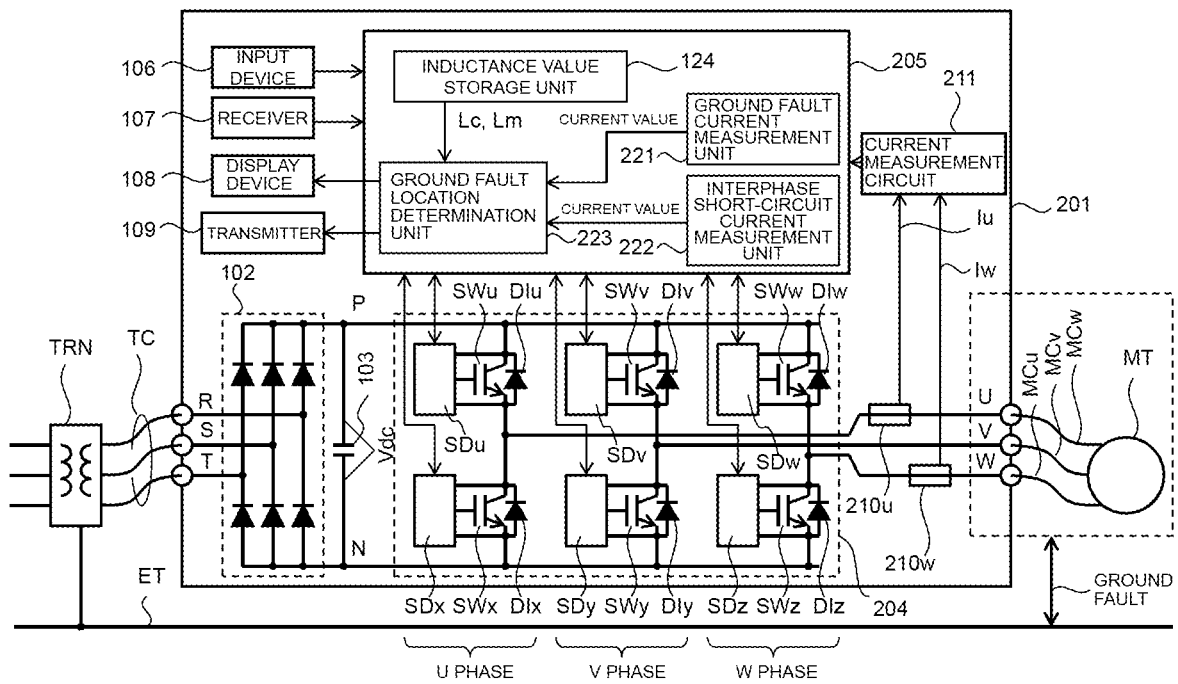
FIG. 9 is a configuration diagram of a power conversion device according to a second embodiment.

FIG. 9 shows a configuration diagram of a power conversion device according to the present embodiment. In FIG. 9, the same components as in FIG. 1 are denoted by the same reference numerals, and the description thereof will be omitted. In FIG. 9, the difference from FIG. 1 is that a current sensor is simplified so as to be installed only for the U phase and the W phase and there is no current sensor for the V phase. In addition, an inverse converter circuit 204, a control circuit 205, a ground fault current measurement unit 221, an interphase short-circuit current measurement unit 222, a ground fault location determination unit 223, and a current measurement circuit 211 in FIG. 9 have the same functions as the inverse converter circuit 104, the control circuit 105, the ground fault current measurement unit 121, the interphase short-circuit current measurement unit 122, the ground fault location determination unit 123, and the current measurement circuit 111 in FIG. 1, although the reference numerals are different in that the values of current sensors for only the U phase and the W phase are treated. Therefore, the description thereof will be omitted.

In FIG. 9, a power conversion device 201 is simplified so that current sensors are installed only for the U phase and the W phase, and there is no current sensor for the V phase. Current sensors 210u and 110w measure current values Iu and Iw output from the output terminals U and W and transmit the measured current values Iu and Iw to the current measurement circuit 211 as analog voltages or currents.

Figure 10:
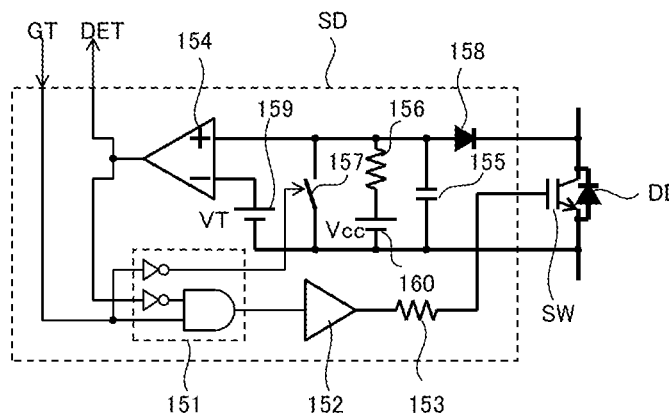
FIG. 10 is a configuration diagram of a switch driver circuit SD in FIG. 9.

FIG. 10 shows a configuration diagram of switch driver circuits SDu, SDv, SDw, SDx, SDy, and SDz in FIG. 9. As shown in FIG. 10, the switch driver circuit is configured to include a logic circuit 151, a gate driving amplifier 152, a gate resistor 153, a comparator 154, a capacitor 155, a capacitor charging resistor 156, a capacitor discharging switch 157, a diode 158, and constant voltage sources 159 and 160. In addition, in FIG. 10, six switches, six diodes, and six switch control circuits provided in the inverse converter circuit 204 have the same configurations, so that the characters of u, v, w, x, y, and z following the reference numerals SW, DI, and SD will be omitted.

The gate driving amplifier 152 and the gate resistor 153 are used for ON/OFF control of the switch SW to be connected. When a gate signal GT from the control circuit 205 is 1, the gate driving amplifier 152 outputs a gate-on voltage to turn on the switch SW. When the gate signal GT is 0, the gate driving amplifier 152 outputs a gate-off voltage to turn off the switch SW. The gate resistor 153 controls the switching speed. On the other hand, the comparator 154, the capacitor 155, the capacitor charging resistor 156, the capacitor discharging switch 157, the diode 158, and the constant voltage sources 159 and 160 form an overcurrent detection circuit. This overcurrent detection circuit is a desaturation detection type circuit. The constant voltage source 160 is a voltage source for an overcurrent threshold voltage VT, and the constant voltage source 159 is a voltage source for a voltage Vcc higher than VT. The overcurrent threshold voltage VT is a value determined from the collector voltage when the current flowing through the switch reaches an overcurrent threshold value Ith. When the switch SW is OFF, the output of the comparator is 0 because the capacitor discharging switch 157 is ON. In addition, when no overcurrent is generated while the switch SW is ON, the voltage of the collector of the switch SW (IGBT) is sufficiently low. Therefore, since the capacitor 155 is discharged through the diode 158, the output of the comparator is 0. However, when an overcurrent is generated while the switch SW is ON, the voltage of the collector of the switch SW (IGBT) becomes higher than the overcurrent threshold voltage VT, so that the capacitor 155 is not discharged. When the capacitor 155 is charged by the charging current of the capacitor charging resistor 156 and the potential of the capacitor exceeds the overcurrent threshold voltage VT, the comparator 154 outputs 1 and the logic circuit 151 forcibly shuts off the switch. In addition, the information of short circuit detection is transmitted to the control circuit 205 as an overcurrent detection signal DET.

As described above, the switch driver circuit shown in FIG. 10 functions as a gate driver circuit having an overcurrent protection function, and transmits the information to the control circuit 205 immediately after the occurrence of a short circuit.

Figure 11:
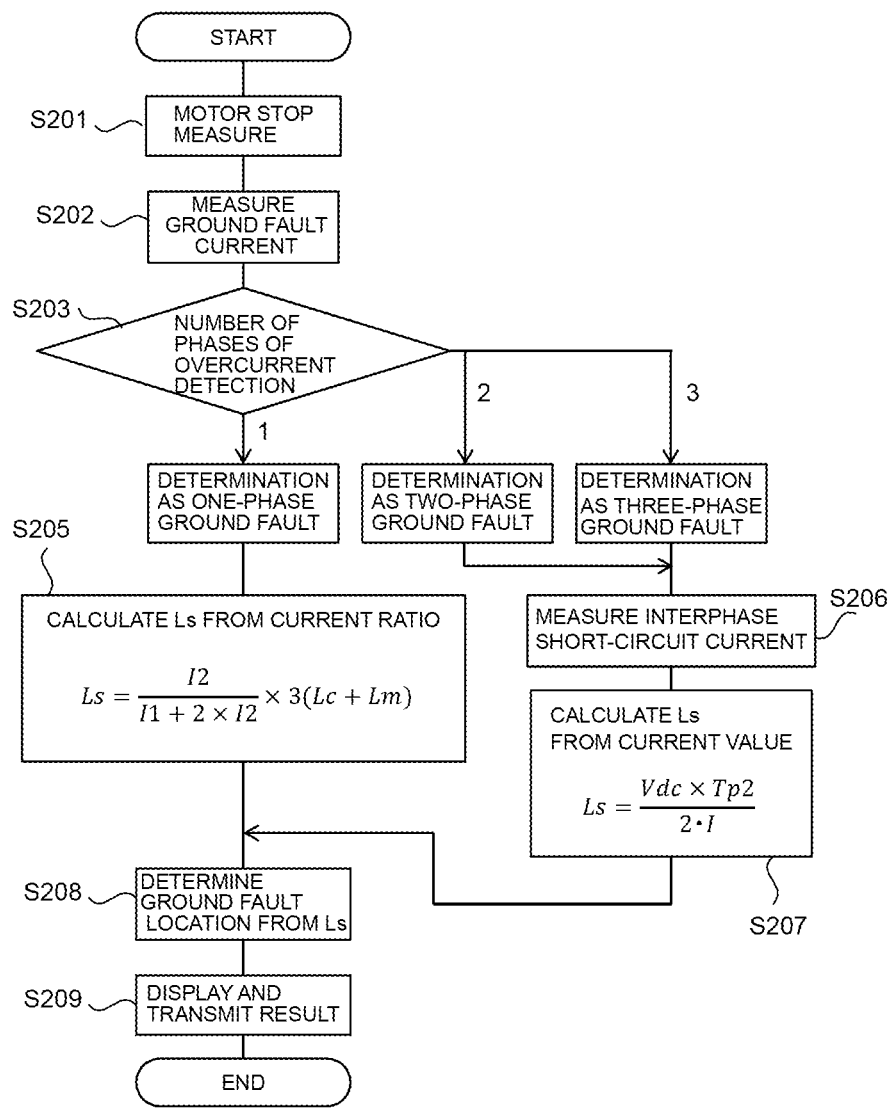
FIG. 11 is a flowchart for determining a ground fault location according to the second embodiment.

FIG. 11 shows a flowchart for determining a ground fault location according to the present embodiment. In FIG. 11, the start and the motor stop measure (S201) are the same as those up to step S101 in FIG. 2 of the first embodiment, and accordingly, these will be omitted.

After the motor is stopped, the ground fault current measurement unit 221 measures a ground fault current (S202). The ground fault current measurement unit turns on all the switches (SWu, SWv, and SWw) of the upper arms or all the switches (SWx, SWy, and SWz) of the lower arms, and waits until the overcurrent is detected by the overcurrent detection signal DET from each switch driver circuit.

The current path when a ground fault short-circuit current is generated in the ground fault current measurement S202 is the same as that in the first embodiment, FIG. 3A in the case of a one-phase ground fault. The case of a one-phase ground fault is FIG. 3(a), the case of a two-phase ground fault is FIG. 3(b), and the case of a three-phase ground fault is FIG. 3(c).

Figure 12:
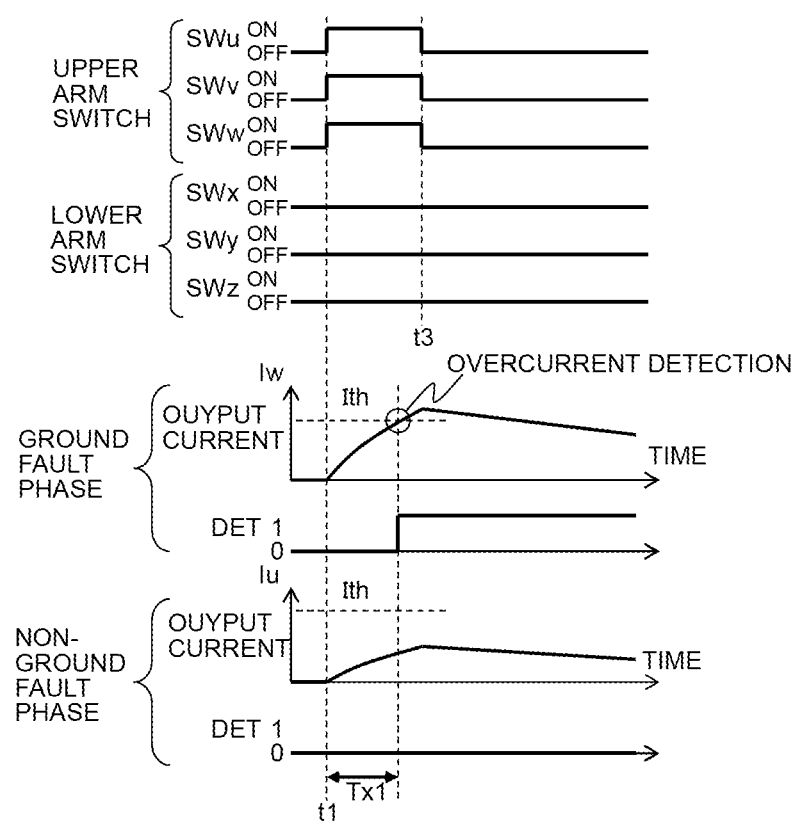
FIG. 12 is a diagram showing a driving pattern example of each switch and a current waveform generated at each phase output at that time in ground fault current measurement step S202 in FIG. 11.

FIG. 12 shows a driving pattern example of each switch and a current waveform generated at each phase output at that time in the ground fault current measurement S202. The upper arm switches SWu, SWv, and SWw are turned on at time t1, and then the upper arm switches SWu, SWv, and SWw are turned off at time t3. The ground fault current increases after time t1, and eventually, the switch driver circuit of the phase that reaches the overcurrent threshold value Ith earliest generates the overcurrent detection signal DET. Here, the phase that reaches the overcurrent threshold value Ith earliest is a phase in which a ground fault has occurred. Therefore, the overcurrent detection signal DET is generated in one phase in the case of a one-phase ground fault, the overcurrent detection signal DET is generated in two phases in the case of a two-phase ground fault, and the overcurrent detection signal DET is generated in all phases in the case of a three-phase ground fault.

At the point in time when the overcurrent detection signal DET described above is received, the ground fault current measurement unit 221 measures the time Tx1 from the time t1 to the reception of the overcurrent detection signal DET. In addition, the current sensors 210u and 210w and the current measurement circuit 211 measure the output current to acquire current values Iu1 and Iw1 of the U phase and the W phase. In addition, all the switches are promptly turned off to protect the switches (time t3).

Here, the description returns to the flowchart of FIG. 11. After the ground fault current measurement S202 described above, the ground fault location determination unit 223 determines that the number of phases of overcurrent detection is the total number of ground fault phases and branches the process (S203). When determination as a one-phase ground fault is made from the number of phases of overcurrent detection, the inductance Ls of the motor cable from the power conversion device 201 to the ground fault location S is calculated from the current ratio (S205). The above Equation (2) is used to calculate the inductance Ls. When the ground fault phase is V phase, that is, when the overcurrent is detected in the V phase, Ith is substituted for I1 in Equation (2), and Iu1 or Iw1 is substituted for I2. When the ground fault phase is U phase, that is, when the overcurrent is detected in the U phase, Ith or Iu1 is substituted for I1 in Equation (2), and Iw1 is substituted for I2. When the ground fault phase is W phase, that is, when the overcurrent is detected in the W phase, Ith or Iw1 is substituted for I1 in Equation (2), and Iu1 is substituted for I2.

On the other hand, when determination as a two-phase ground fault or a three-phase ground fault is made from the number of phases of overcurrent detection, the interphase short-circuit current measurement unit 222 measures the interphase short-circuit current (S206). The current path when the interphase short-circuit current is generated in the interphase short-circuit current measurement S206 is the same as that in the first embodiment, and is shown in FIG. 5. In addition, an example of the driving pattern of each switch and the current waveform generated at each phase output at that time in the interphase short-circuit current measurement S206 are the same as those in the first embodiment, and are shown in FIG. 6.

The interphase short-circuit current measurement unit 222 turns on one switch of the upper arm of the phase determined to be a ground fault and one switch of the lower arm of another phase determined to be a ground fault. After the elapse of the time tx2 from the time t6 when the two switches are turned on, the current sensors 210u and 210w and the current measurement circuit 211 measure the output current to acquire the measured current values Iu2 and Iw2.

After the interphase short-circuit current measurement S206, the inductance Ls of the motor cable from the power conversion device 201 to the ground fault location S is calculated using the above Equation (3) or the linear and easy-to-use Equation (4) (S207). The larger one of the current values Iu2 and Iw2 is substituted for the current I. In addition, the current path of the interphase short-circuit current passes through the outputs of the two phases. For this reason, even if there is no current sensor for one of the phases, a current sensor is present at the output of the remaining phases. Therefore, the interphase short-circuit current can be acquired from the measured value.

S208 and S209 are similar to S108 and S109 in FIG. 2.

As described above, according to the present embodiment, as in the first embodiment, even when ground faults of a plurality of phases occur at locations close to each other, it is possible to determine the ground fault locations on the motor and the cable and notify the user or the external device or system of the determination result.

Third Embodiment

In the present embodiment, an example will be described in which the power conversion devices described in the first and second embodiments are applied as industrial inverters.

Figure 13:
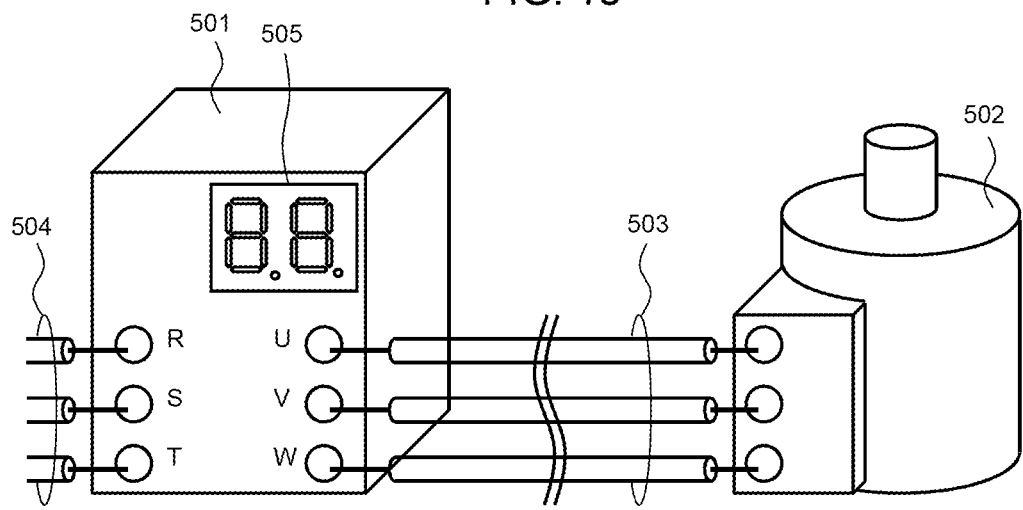
FIG. 13 is a diagram showing an example in which the power conversion devices according to the first and second embodiments are applied as industrial inverters.

FIG. 13 is a diagram showing an example in which the power conversion devices according to the first and second embodiments are applied as industrial inverters. In FIG. 13, a power conversion device 501 is each power conversion device described in the first and second embodiments, and is connected to a drive motor 502 by a motor cable 503. The power conversion device 501 receives the supply of power from the outside through an AC power cable 504. The motor 502 is used to drive various industrial devices, such as air conditioners, compressors, conveyors, and elevators. When a ground fault occurs inside the motor 502 or on the motor cable 503, the information of the short-circuit location is displayed on a display device 505 provided in the power conversion device 501, and notification of the ground fault location is provided to the external system by wireless transmission.

Figure 14:
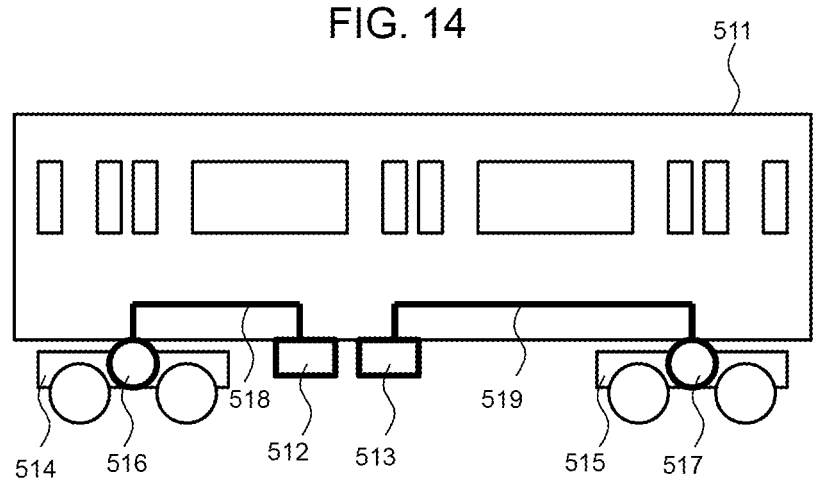
FIG. 14 is a diagram showing an example in which the power conversion devices according to the first and second embodiments are applied to a railway vehicle.

FIG. 14 is a diagram showing an example in which the power conversion devices according to the first and second embodiments are applied to a railway vehicle. Power conversion devices 512 and 513 described in the first and second embodiments are provided under the floor of a railway vehicle 511. Drive motors 516 and 517 are provided in bogies 514 and 515 of the railway vehicle 511. The motors and the power conversion device are connected by motor cables 518 and 519. When a ground fault occurs inside the motors 516 and 517 or on the motor cables 518 and 319, the information of the short- circuit location is displayed on display devices provided in the power conversion devices 512 and 513, and notification of the ground fault location is provided to the external system by wireless transmission.

Figure 15:
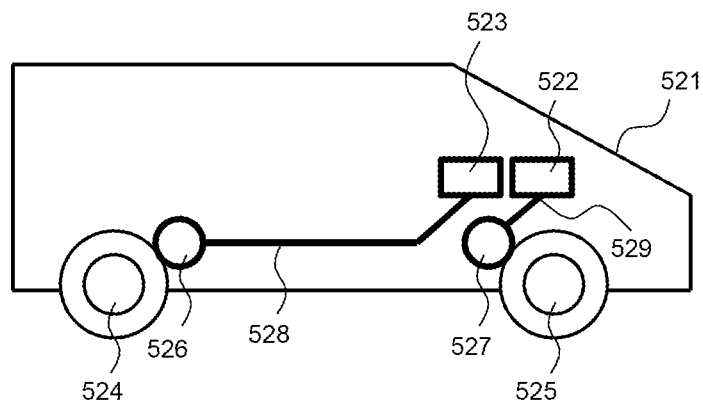
FIG. 15 is a diagram showing an example in which the power conversion devices according to the first and second embodiments are applied to an automobile with an electric motor.

FIG. 15 is a diagram showing an example in which the power conversion devices according to the first and second embodiments are applied to an automobile with an electric motor. Power conversion devices 522 and 523 described in the first and second embodiments are provided inside an automobile 521. In addition, motors 526 and 527 for driving wheels 524 and 525 are provided, and connections to the power conversion device are made by motor cables 528 and 259. When a ground fault occurs inside the motors 526 and 527 or on the motor cables 528 and 259, the information of the short-circuit location is displayed on display devices provided in the power conversion devices 522 and 523, and notification of the ground fault location is provided to the external system by wireless transmission.

Figure 16:
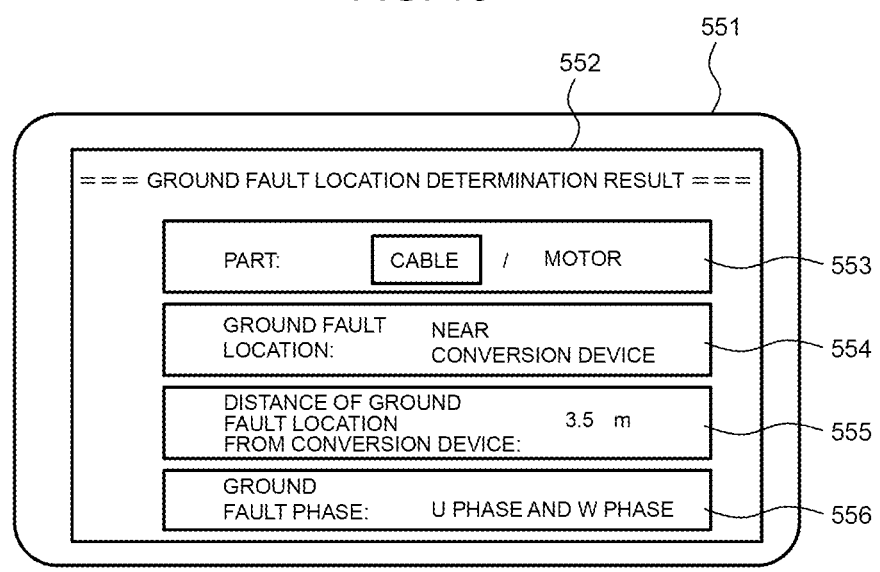
FIG. 16 is a diagram showing an example of a tablet type terminal that displays ground fault location determination results of the power conversion devices according to the first and second embodiments.
Figure 17:
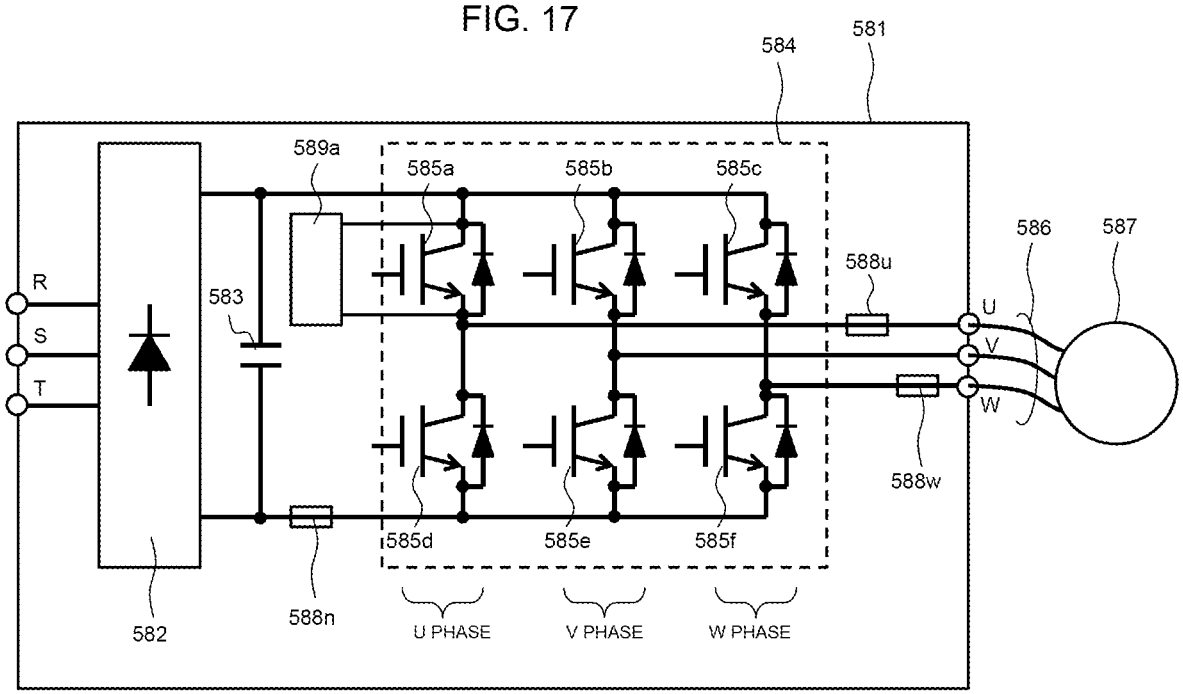
FIG. 17 is a configuration diagram showing a conventional power conversion device, a motor, and a cable connecting these to each other.
Figure 18:
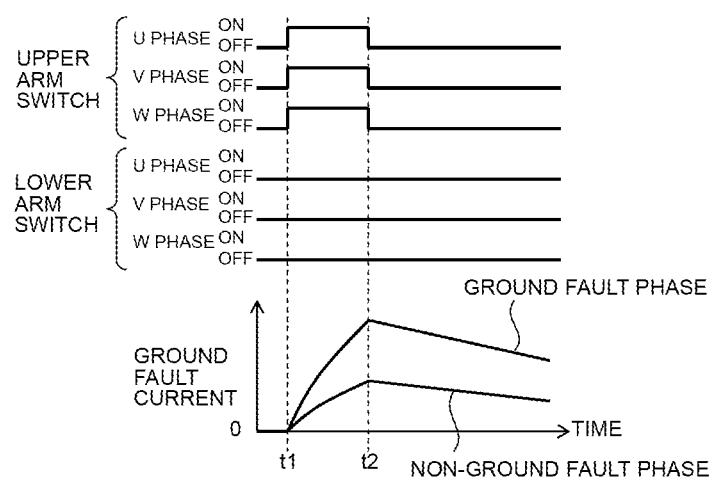
FIG. 18 is a diagram showing examples of a switch driving waveform and ground fault current waveforms of a ground fault phase and a non-ground fault phase in a conventional power conversion device.

FIG. 16 is a diagram showing an example of a tablet type terminal that displays the ground fault location determination results of the power conversion devices according to the first and second embodiments. A tablet type terminal 551 has a liquid crystal display screen 552, and ground fault occurrence location information is displayed on the liquid crystal display screen 552 according to the received code by the installed application.

Determination results 553 to 556 are displayed on the liquid crystal display screen 552. The determination result 553 represents the determination result of a short-circuited part, and in this display example, "cable" is highlighted to indicate that a ground fault has occurred in the cable. The determination result 554 represents the determination result of the ground fault location, and in this display example, it is displayed that a ground fault has occurred in the vicinity of the conversion device. The determination result 555 represents the calculation result of the distance from the conversion device at the ground fault location, and in this display example, it is displayed that a ground fault has occurred on the cable 3.5 m ahead of the conversion device. The determination result 556 represents the determination result of the ground fault phase, and in this display example, it is displayed that a ground fault has occurred in the U phase and the W phase.

While the embodiments of the present invention have been described above, the present invention is not limited to the embodiments described above, and includes various modification examples. For example, the above embodiments have been described in detail for easy understanding of the present invention, but the present invention is not necessarily limited to having all the components described above. In addition, some of the components in one embodiment can be replaced with the components in another embodiment, and the components in another embodiment can be added to the components in one embodiment. In addition, for some of the components in each embodiment, addition, removal, and replacement of other components are possible.

REFERENCE SIGNS LIST

SW, SWu, SWv, SWw, SWx, SWy, SWz Switch
DI, DIu, DIv, DIw, DIx, DIy, DIz Diode
SD, SDu, SDv, SDw, SDx, SDy, SDz Switch driver circuit
MC, MCu, MCv, MCw Motor cable
MT Motor
TC Power cable
TRN Transformer
ET Earth and neutral line
101 Power conversion device
102 Forward converter circuit
103 Smoothing capacitor
104 Inverse converter circuit
105 Control circuit
106 Input device
107 Receiver
108 Display device
109 Transmitter
110u, 110v, 110w Current sensor
111 Current measurement circuit
121 Ground fault current measurement unit
122 Interphase short-circuit current measurement unit
123 Ground fault location determination unit
124 Inductance value storage unit
131 Decoder
132 LED driver
133 LED segment
141 Modulator
142 Amplifier
151 Logic circuit
152 Gate driving amplifier
153 Gate resistor
154 Comparator
155 Capacitor
156 Capacitor charging resistor
157 Capacitor discharging switch
158 Diode
159, 160 Constant voltage source
201 Power conversion device
204 Inverse converter circuit
205 Control circuit
210u, 210w Current sensor
211 Current measurement circuit
221 Ground fault current measurement unit
222 Interphase short-circuit current measurement unit
223 Ground fault location determination unit

The invention claimed is:

1. A power conversion device that includes a plurality of switches formed of semiconductors and drives a three-phase motor connected by a three-phase cable by controlling ON/OFF of the switches, the device comprising:
    a forward converter circuit that is configured to include diodes and converts AC power from a power source into DC power;
    an inverse converter circuit configured to include three half-bridge circuits for controlling a current supplied to the motor;
    a plurality of driver circuits for driving the plurality of switches forming the half- bridge circuits;
    a control circuit for controlling the driver circuits; and
    an information output unit for providing notification of an internal state of the device to an outside,
    wherein the control circuit includes a ground fault current measurement unit, an interphase short-circuit current measurement unit, and a ground fault location determination unit,
    when investigating a location of a ground fault occurring in the cable and the motor,
    the ground fault current measurement unit turns on all the switches of either upper arms or lower arms of the three half-bridge circuits, and measures output current values of a plurality of phases generated during the ON period,
    the interphase short-circuit current measurement unit turns on a switch of an upper arm of one phase of the three half-bridge circuits and a switch of a lower arm of a phase different from the one phase, and measures output current values of a plurality of phases generated during a period of time for which both the switches are ON, and
    the ground fault location determination unit determines a ground fault location based on the output current values measured by the ground fault current measurement unit and the output current values measured by the interphase short-circuit current measurement unit.

2. The power conversion device according to claim 1, wherein the ground fault location determination unit compares current values of three phases measured by the ground fault current measurement unit, and
    when it is determined that the current values of two phases are equal and the current value of one phase is larger than the others, the ground fault location determination unit determines a ground fault location based on a current ratio thereof, and when it is determined that the current values of the two phases are equal and the current value of the one phase is smaller than the others or when it is determined that the current values of the three phases are equal, the ground fault location determination unit determines a ground fault location based on the output current values measured by the interphase short-circuit current measurement unit.

3. The power conversion device according to claim 1, wherein the driver circuit includes an overcurrent detection circuit, and the ground fault location determination unit observes overcurrent detection by the overcurrent detection circuit during a period of time for which all the switches are ON, and determines a ground fault location based on a current ratio of the output current values measured by the ground fault current measurement unit when an overcurrent is detected in one phase and determines a ground fault location based on the output current values measured by the interphase short-circuit current measurement unit when an overcurrent is detected in two or three phases.

4. The power conversion device according to claim 1,
wherein the ground fault location determination unit compares current values of three phases measured by the ground fault current measurement unit, when it is determined that the current values of two phases are equal and the current value of one phase is larger than the others, the ground fault location determination unit calculates an inductance value of a current path from an output to a ground fault location based on a current ratio thereof, and when it is determined that the current values of the two phases are equal and the current value of the one phase is smaller than the others or when it is determined that the current values of the three phases are equal, the ground fault location determination unit calculates the inductance value of the current path from the output to the ground fault location based on the output current values measured by the interphase short-circuit current measurement unit, and the ground fault location determination unit determines the ground fault location from the inductance value.

5. The power conversion device according to claim 4,
wherein the control circuit includes an inductance value storage unit that stores inductance values of a cable and a winding inside the motor input from the outside, and the ground fault location determination unit determines the ground fault location by comparing the calculated inductance value with the inductance value stored in the inductance value storage unit.

6. The power conversion device according to claim 1,
wherein the driver circuit includes an overcurrent detection circuit, and the ground fault location determination unit observes overcurrent detection by the overcurrent detection circuit during a period of time for which all the switches are ON, calculates an inductance value of a current path from an output to a ground fault location based on a current ratio thereof when an overcurrent is detected in one phase and calculates the inductance value of the current path from the output to the ground fault location based on the output current values measured by the interphase short-circuit current measurement unit when an overcurrent is detected in two or three phases, and determines the ground fault location from the calculated inductance value.

7. The power conversion device according to claim 1,
wherein current sensors are provided for three of three output phases, and the ground fault current measurement unit and the interphase short-circuit current measurement unit use current values measured by the three current sensors.

8. The power conversion device according to claim 1,
wherein current sensors are provided for two of three output phases, the driver circuit includes an overcurrent detection circuit, and the ground fault current measurement unit and the interphase short-circuit current measurement unit measure a current using current values measured by the two current sensors and an overcurrent threshold value of the overcurrent detection circuit.

9. The power conversion device according to claim 1,
wherein the information output unit is a display device, and displays the determination result.

10. The power conversion device according to claim 1,
wherein the information output unit is a transmitter, and transmits the determination result to the outside of the device.

11. A ground fault location diagnosis method executed by a control circuit built into a power conversion device that includes a plurality of half-bridge circuits configured by a plurality of switches formed of semiconductors and drives a three-phase motor connected by a three-phase cable by controlling ON/OFF of the switches, the method comprising:

when investigating a location of a ground fault occurring in the cable and the motor, turning on all the switches of either upper arms or lower arms of the plurality of half-bridge circuits and measuring output current values of a plurality of phases generated during the ON period as ground fault currents, turning on a switch of an upper arm of one phase of the plurality of half-bridge circuits and a switch of a lower arm of a phase different from the one phase and measuring output current values of a plurality of phases, which are generated during a period of time for which both the switches are ON, as interphase short-circuit currents, and determining a ground fault location based on the output current values measured as the ground fault currents and the output current values measured as the interphase short-circuit currents.

12. The ground fault location diagnosis method according to claim 11,
wherein output current values of three phases measured as the ground fault currents are compared with each other, when it is determined that the current values of two phases are equal and the current value of one phase is larger than the others, an inductance value of a current path from an output of the power conversion device to a ground fault location is calculated based on a current ratio of ground fault currents of the respective phases, when it is determined that the current values of the two phases are equal and the current value of the one phase is smaller than the others or when it is determined that the current values of the three phases are equal, the inductance value of the current path from the output of the power conversion device to the ground fault location is calculated based on the output current values measured as the interphase short-circuit currents, and the ground fault location is determined by comparing the calculated inductance value with an inductance value of a total length of the cable and a motor winding inductance value.

13. The ground fault location diagnosis method according to claim 12, wherein, when the calculated inductance value is smaller than the inductance value of the total length of the cable, it is determined that a ground fault has occurred on the cable, and when the calculated inductance value is larger than the inductance value of the total length of the cable, it is determined that a ground fault has occurred inside the motor.

14. The ground fault location diagnosis method according to claim 12, wherein it is determined that a ground fault has occurred in the vicinity of the power conversion device when the calculated inductance value is close to 0, a ground fault has occurred on the cable near the motor when the calculated inductance value is close to and smaller than the inductance value of the total length of the cable, a ground fault has occurred in the vicinity of a connection terminal inside the motor when the calculated inductance value is close to and larger than the inductance value of the total length of the cable, a ground fault has occurred in the vicinity of a neutral point inside the motor when the calculated inductance value is close to and smaller than a value obtained by adding up the inductance value of the total length of the cable and the motor winding inductance value.

15. The ground fault location diagnosis method according to claim 12, wherein a relative location of a ground fault location of the cable with respect to the total length of the cable is determined based on a value obtained by dividing the calculated inductance value by the inductance value of the total length of the cable.

* * * * *